United States Patent
Cheng et al.

(10) Patent No.: US 11,063,333 B2
(45) Date of Patent: Jul. 13, 2021

(54) MULTILAYER ELECTROMAGNETIC WAVE TRANSMISSION BOARD ASSEMBLED BY AN ADHESIVE AND INCLUDING A BARRIER TO BLOCK THE ADHESIVE FROM FLOWING INTO A WAVEGUIDE CHANNEL

(71) Applicant: BOARDTEK ELECTRONICS CORPORATION, Taoyuan (TW)

(72) Inventors: Wen-Feng Cheng, Taipei (TW); Chien-Cheng Lee, Taoyuan (TW)

(73) Assignee: BOARDTEK ELECTRONICS CORPORATION, Taoyuan (TW)

( * ) Notice: Subject to any disclaimer, the term of this patent is extended or adjusted under 35 U.S.C. 154(b) by 0 days.

(21) Appl. No.: 16/517,318

(22) Filed: Jul. 19, 2019

(65) Prior Publication Data
US 2020/0128702 A1  Apr. 23, 2020

(30) Foreign Application Priority Data
Oct. 17, 2018 (TW) .................. 107136537

(51) Int. Cl.
*H01P 3/12* (2006.01)
*H05K 9/00* (2006.01)

(52) U.S. Cl.
CPC ............... *H01P 3/121* (2013.01); *H01P 3/12* (2013.01); *H05K 9/0052* (2013.01); *H05K 9/0071* (2013.01)

(58) Field of Classification Search
CPC ........... H01P 3/12; H01P 3/121; H01P 11/002
USPC .......................................................... 333/239
See application file for complete search history.

(56) References Cited

U.S. PATENT DOCUMENTS

| 5,398,010 A * | 3/1995 | Klebe | H01P 11/002 156/150 |
| 7,480,435 B2 * | 1/2009 | Brist et al. | H01P 3/121 385/129 |
| 8,054,142 B2 * | 11/2011 | Fujita | H01P 3/121 333/1 |

(Continued)

FOREIGN PATENT DOCUMENTS

| CN | 101022698 A | 8/2007 |
| CN | 101026933 A | 8/2007 |

(Continued)

*Primary Examiner* — Benny T Lee
(74) *Attorney, Agent, or Firm* — Li & Cai Intellectual Property (USA) Office

(57) ABSTRACT

An electromagnetic wave transmission board includes a composite board and a plated metal layer. The composite board has a plurality of inner walls surroundingly defining an elongated channel in an interior of the composite board. The plated metal layer is formed on at least part of the inner walls so as to jointly form an inner channel structure in the channel. The inner channel structure surroundingly defines a predetermined space filled with air, and the inner channel structure has two entrances in air communication with the predetermined space. The predetermined space of the inner channel structure is configured to receive and output an electromagnetic wave signal through the two entrances, respectively, and the electromagnetic wave transmission board is configured to transmit the electromagnetic wave signal by using the air in the predetermined space of the inner channel structure as a conductive medium.

2 Claims, 17 Drawing Sheets

(56) References Cited

U.S. PATENT DOCUMENTS

2015/0359087 A1* 12/2015 Lee .................. H05K 1/0326
174/255

FOREIGN PATENT DOCUMENTS

| CN | 101527378 A | 9/2009 |
| CN | 105101609 A | 11/2015 |
| CN | 106415922 A | 2/2017 |
| CN | 106848519 A | 6/2017 |
| CN | 207305036 U | 5/2018 |
| TW | 201824634 A | 7/2018 |

* cited by examiner

MULTILAYER ELECTROMAGNETIC WAVE TRANSMISSION BOARD ASSEMBLED BY AN ADHESIVE AND INCLUDING A BARRIER TO BLOCK THE ADHESIVE FROM FLOWING INTO A WAVEGUIDE CHANNEL

CROSS-REFERENCE TO RELATED PATENT APPLICATION

This application claims the benefit of priority to Taiwan Patent Application No. 107136537, filed on Oct. 17, 2018. The entire content of the above identified application is incorporated herein by reference.

FIELD OF THE DISCLOSURE

The present disclosure relates to a composite board, and more particularly to an electromagnetic wave transmission board for transmitting electromagnetic wave signal.

BACKGROUND OF THE DISCLOSURE

Due to the conventional technical prejudice, that a composite board is mostly formed as a circuit board for transmitting electric current, the range of applications of the composite board has been limited. Accordingly, it is difficult for the composite board, which has a relatively mature manufacturing technology and can be quickly manufactured, to be applied to other fields (e.g., electromagnetic wave transmission).

SUMMARY OF THE DISCLOSURE

In response to the above-referenced technical inadequacies, the present disclosure provides an electromagnetic wave transmission board to effectively improve the issues associated with conventional composite boards.

In one aspect, the present disclosure provides an electromagnetic wave transmission board, which includes a composite board and at least one plated metal layer. The composite board has a plurality of inner walls surroundingly defining an elongated channel in an interior of the composite board. The at least one plated metal layer is formed on at least part of the inner walls so as to jointly form an inner channel structure in the channel. The inner channel structure surroundingly defines a predetermined space filled with air, and the inner channel structure has two entrances in air communication with the predetermined space. The predetermined space of the inner channel structure is configured to receive and output an electromagnetic wave signal through the two entrances, respectively, and the electromagnetic wave transmission board is configured to transmit the electromagnetic wave signal by using the air in the predetermined space of the inner channel structure as a conductive medium.

In certain embodiments, the composite board includes an inner plate, two outer plates, an adhesive, and two conductive layers. The inner plate includes at least part of the inner walls. The at least one plated metal layer is formed on the inner walls of the inner plate. The two outer plates are arranged at two opposite sides of the inner plate, respectively. The adhesive is formed to bond each of the two outer plates onto the inner plate. The two conductive layers are respectively disposed on two surfaces of the two outer plates facing each other. Each of the two conductive layers includes a shielding portion. The inner walls of the inner plate and the two shielding portions of the two conductive layers jointly define a portion of the channel. The two entrances are formed in at least one of the two shielding portions. The inner channel structure is formed by the two shielding portions and the at least one plated metal layer.

In certain embodiments, the composite board includes a multilayer structure, a first conductive layer, and a second conductive layer. The first conductive layer and the second conductive layer are disposed on two opposite surfaces of the multilayer structure, respectively. At least one of the first conductive layer and the second conductive layer cooperates with the multilayer structure to jointly define the channel, and has two openings respectively corresponding in position to the two entrances.

Therefore, the electromagnetic wave transmission board of the present disclosure can be formed with the inner channel structure in the composite board, and the electromagnetic wave transmission board can be configured to transmit an electromagnetic wave signal through the predetermined space and the two entrances of the inner channel structure, so that the electromagnetic wave transmission board of the present disclosure is provided in a structure that can be easily manufactured.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings where like components are denoted by the same reference label througout the drawings.

DETAILED DESCRIPTION OF THE EXEMPLARY EMBODIMENTS

Figure 1:
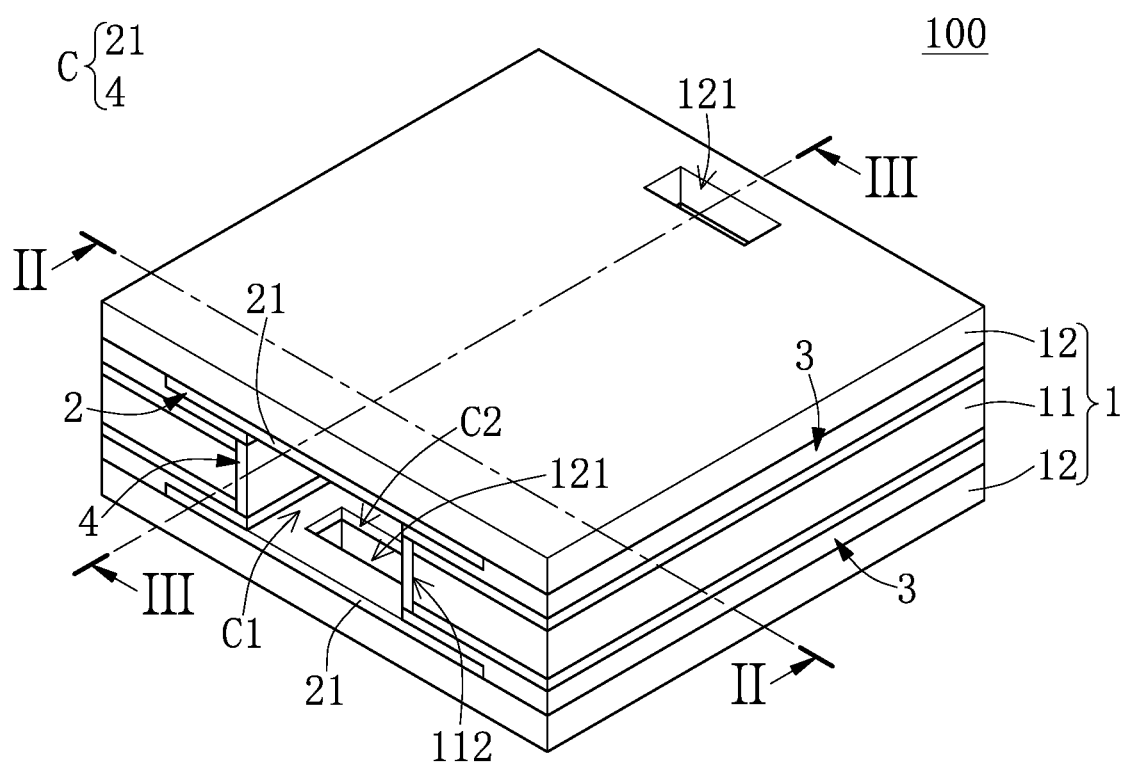
FIG. 1 is a perspective view of an electromagnetic wave transmission board according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIGS. 1, 2, 3, 4A, 4B, 4C, 5, 6A and 6B, a first embodiment of the present disclosure provides an electromagnetic wave transmission board 100, which includes a multilayer structure 1 (FIGS. 1, 2, 3, 4A, 4B, 4C, 5, 6A and 6B), two conductive layers 2 (FIGS. 1, 2, 4A, 4B and 4C), an adhesive 3 (FIGS. 1, 2, 4A, 4B, 6, 6A and 6B), and a plurality of plated metal layers 4 (FIGS. 1, 2, 3, 4A, 4B, 4C, 5, 6A and 6B). The electromagnetic wave transmission board 100 in the present embodiment can be regarded as a channel type circuit board for transmitting an electromagnetic wave signal and not a current signal. In other words, any circuit board provided for transmitting a current signal is different from the electromagnetic wave transmission board 100 of the present embodiment. Moreover, the two conductive layers 2 and the plated metal layers 4 in the present embodiment are jointly formed as an inner channel structure C (FIGS. 1, 2, 3, 4A, 4B, 4C, 5, 6A and 6B).

The multilayer structure 1 in the present embodiment includes an inner plate 11 (FIGS. 1, 2, 4A, 4B, 4C, 5, 6A and 6B) and two outer plates 12 respectively arranged at two opposite sides of the inner plate 11. The inner plate 11 in the present embodiment includes two conductive layers (not labeled) disposed on two opposite sides thereof, but the present disclosure is not limited thereto. Moreover, the inner plate 11 includes a plurality of inner walls 111 (FIGS. 2, 6A and 6B) jointly defining a thru-hole 112 (FIGS. 1, 2, 4A, 4B and 4C), and at least one of the two outer plates 12 has two openings 121 (FIGS. 1, 2, 3, 4A, 5, 6A, and 6B). That is to say, the two openings 121 in the present embodiment can be formed in one of the two outer plates 12 shown in FIG. 4A, or can be respectively formed in the two outer plates 12 shown in FIGS. 1, 2 and 3, but the present disclosure is not limited thereto.

Specifically, each of the two outer plates 12 or the inner plate 11 is formed by a preimpregnated material, and the preimpregnated material can be glass fiber prepreg, carbon fiber prepreg, or epoxy resin. Moreover, each of the two outer plates 12 or the inner plate 11 can be a soft plate. For example, each of the two outer plates 12 or the inner plate 11 can be formed by polyester (PET) or polyimide (PI) and does not contain any glass fibers and carbon fibers. However, each of the two outer plates 12 or the inner plate 11 in the present disclosure is not limited to the above conditions.

In addition, the inner plate 11 and the outer plate 12 in the present embodiment are named according to the relative position thereof, but the inner plate 11 or the outer plate 12 is not limited to a single layer structure. For example, in other embodiments of the present disclosure, the inner plate 11 or the outer plate 12 can be formed by stacking a plurality of plates, and the multilayer structure 1 may include more than three layers.

Figure 2:
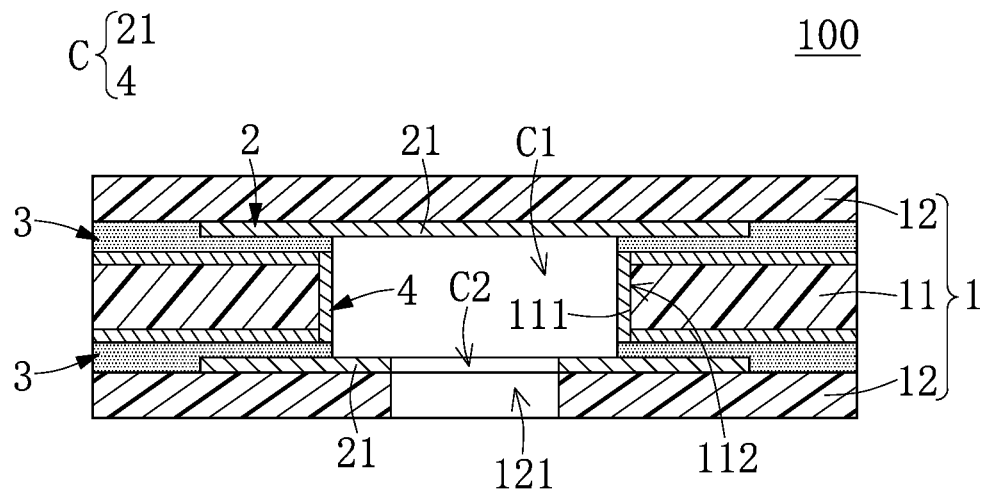
FIG. 2 is a cross-sectional view taken along a cross-sectional line II-II of FIG. 1.
Figure 3:
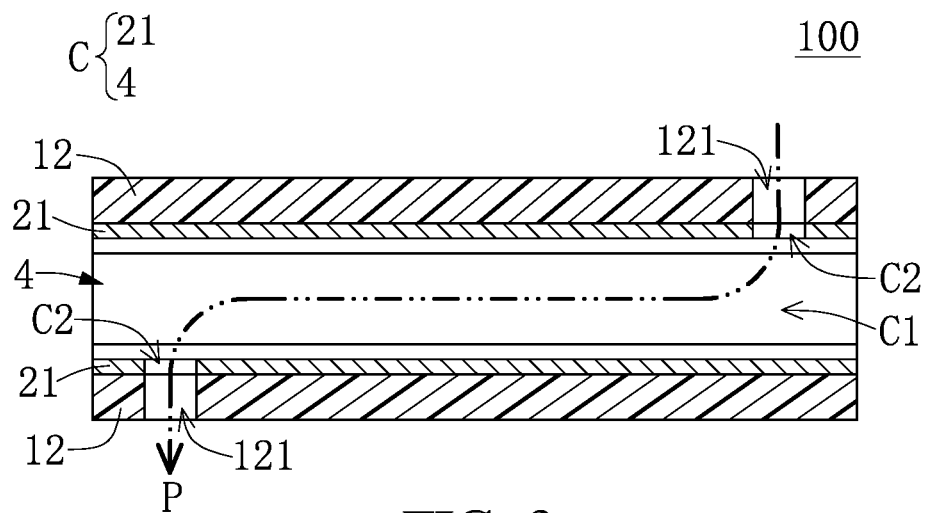
FIG. 3 is a cross-sectional view taken along a cross-sectional line of FIG. 1.

As shown in FIGS. 1, 2 and 3, the two conductive layers 2 (FIGS. 1 and 2) are respectively disposed on two surfaces (e.g., two inner surfaces) of the two outer plates 12 facing each other, and respectively cover two opposite sides of the thru-hole 112 (FIGS. 1 and 2) of the inner plate 11. The two outer plates 12 and the inner plate 11 (FIGS. 1 and 2) in the present embodiment are combined by a lamination process, and each of the two outer plates 12 is bonded onto the inner plate 11 through the adhesive 3.

The inner plate 11 is formed with the thru-hole 112 before the lamination process of the multi-layer structure 1.

The thru-hole 112 of the inner plate 11 can be formed by using a non-chemical etching manner (e.g., laser drilling, plasma etching, or milling). Specifically, a laser drilling manner can be used to ablate the inner plate 11 to form the thru-hole 112; or the thru-hole 112 can be formed by milling a portion of the inner plate 11. Moreover, the thru-hole 112 can be formed by milling a portion of the inner plate 11, and then a laser drilling manner can be used to ablate the portion of the inner plate 11 to form the thru-hole 112.

A portion of each of the two conductive layers 2 covering the thru-hole 112 in the present embodiment is defined as a shielding portion 21. At least one of the shielding portions 21 of the two conductive layers 2 has two entrances C2 respectively corresponding in position to the two openings 121. In other words, the two entrances C2 of the electromagnetic wave transmission board 100 in the present embodiment can be formed in one of the shielding portion 21 shown in FIG. 4A or FIG. 4B, or can be respectively formed in the two shielding portions 21 shown in FIGS. 1, 2 and 3.

As shown in FIGS. 1, 2 and 3, the plated metal layers 4 are respectively formed (e.g., coated) on the inner walls 111 (FIG. 2) of the inner plate 11, (FIGS. 1 and 2), and the inner channel structure C is formed by the plated metal layers 4 and the shielding portions 21 of the two conductive layers 2 (FIGS. 1 and 2). In the present embodiment, the inner channel structure C is arranged in the thru-hole 112 of the multilayer structure 1 (FIGS. 1 and 2) so as to surroundingly form a predetermined space C1, and at least one of the shielding portions 21 of the inner channel structure C is formed with the two entrances C2 in air communication with the predetermined space C1, so that the predetermined space C1 can be in air communication with an external space through each of the two entrances C2 and the corresponding opening 121.

Moreover, the inner channel structure C is formed by the plated metal layers 4 and the shielding portions 21 of the two conductive layers 2, so that the inner channel structure C can provide an electromagnetic shield for the predetermined space C1 for expanding the range of application of the electromagnetic wave transmission board 100 of the present embodiment.

Figure 4A:
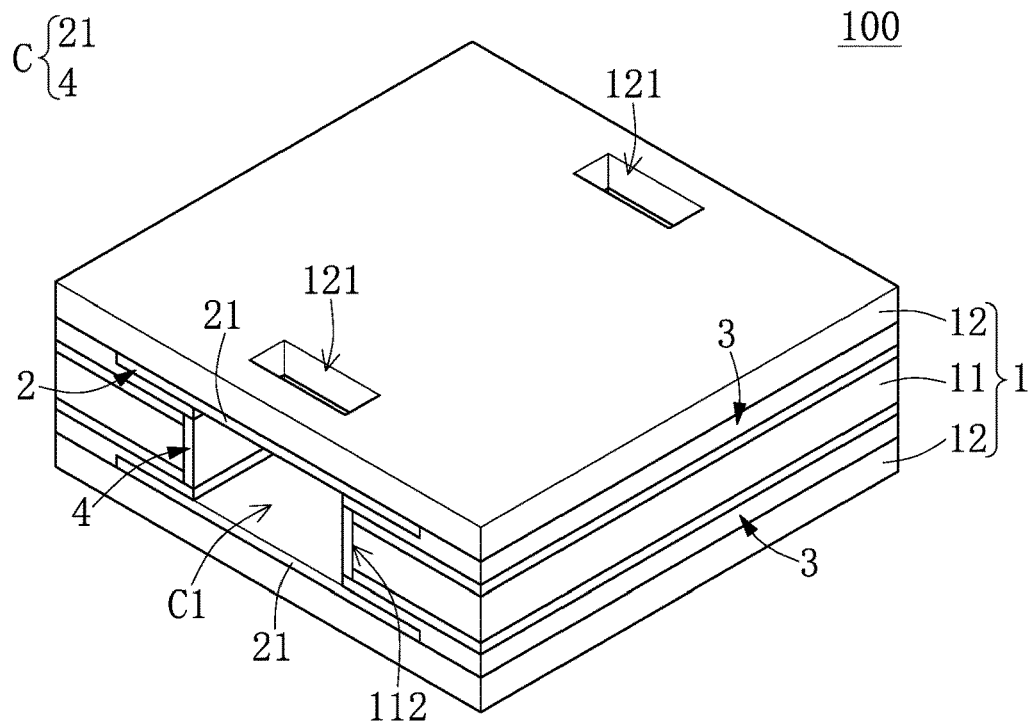
FIG. 4A is a perspective view showing the electromagnetic wave transmission board in a first variant configuration.

Specifically, as shown in FIG. 3, the two outer plates 12 can be respectively formed with the two openings 121, and the two shielding portions 21 can be respectively formed with the two entrances C2, so that the predetermined space C1 and the two entrances C2 of the inner channel structure C can cooperate with the two openings 121 of the two outer plates 12 to jointly form a medium path P penetrating through the electromagnetic wave transmission board 100. As shown in FIG. 4A, the two openings 121 of the multi-layer structure 1 can be formed in one of the two outer plates 12, and the other outer plate 12 is formed without any opening 12. The two entrances C2 (FIG. 4B) can be formed in one of the two shielding portions 21 of the inner channel structure C, and the outer shielding portion 21 is formed without any entrance C2.

Moreover, a medium in the predetermined space C1, the two entrances C2, and the two openings 121 in the present embodiment is limited to air, but the present disclosure is not limited thereto. In other words, a space of a circuit board receiving a component (e.g., chip) or a structure is different from the predetermined space C1 of the electromagnetic wave transmission board 100 of the present embodiment. Moreover, each of the number of the entrances C2 and the number of the openings 121 in the drawings of the present embodiment is two, but can be adjusted or changed according to design requirements (e.g., more than two).

Figure 4B:
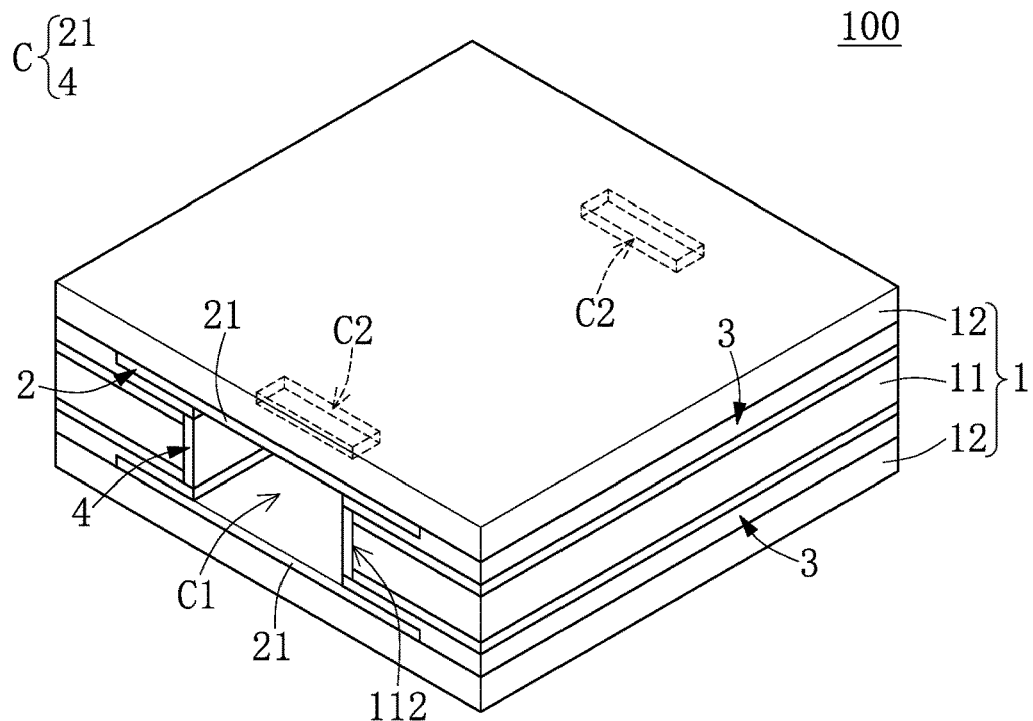
FIG. 4B is a perspective view showing the electromagnetic wave transmission board in a second variant configuration.
Figure 5:
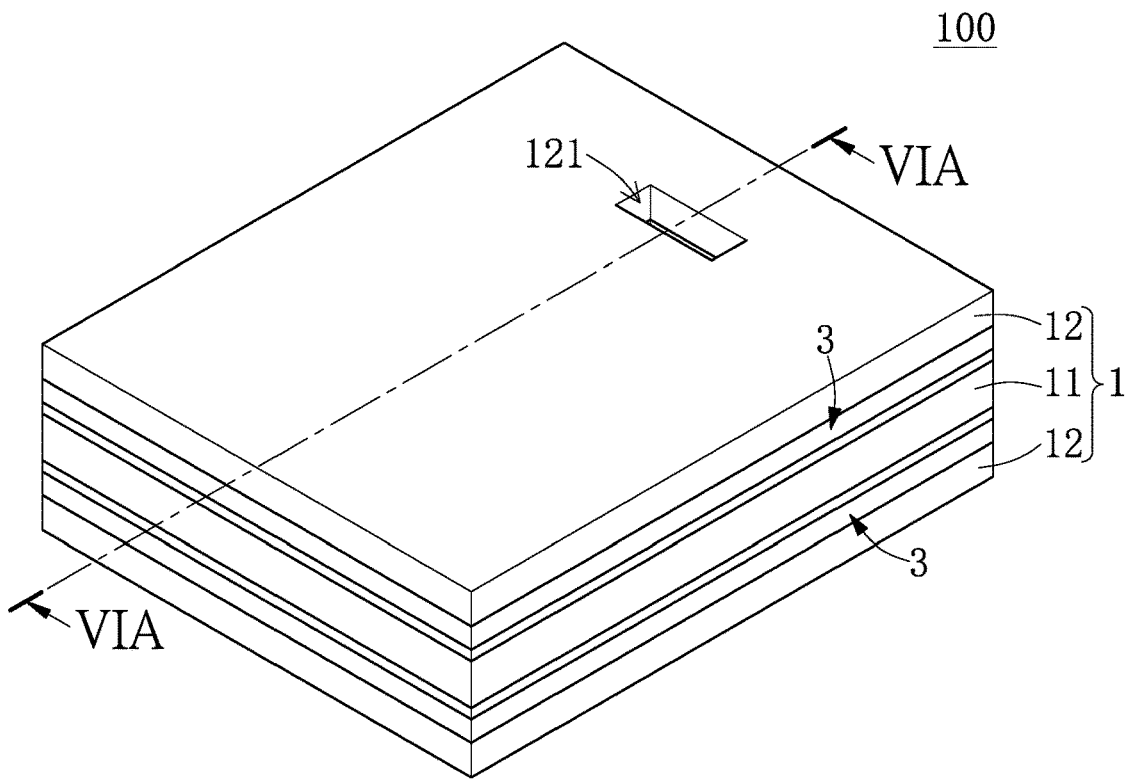
FIG. 5 is a perspective view showing the electromagnetic wave transmission board in a fourth variant configuration.
Figure 6A:
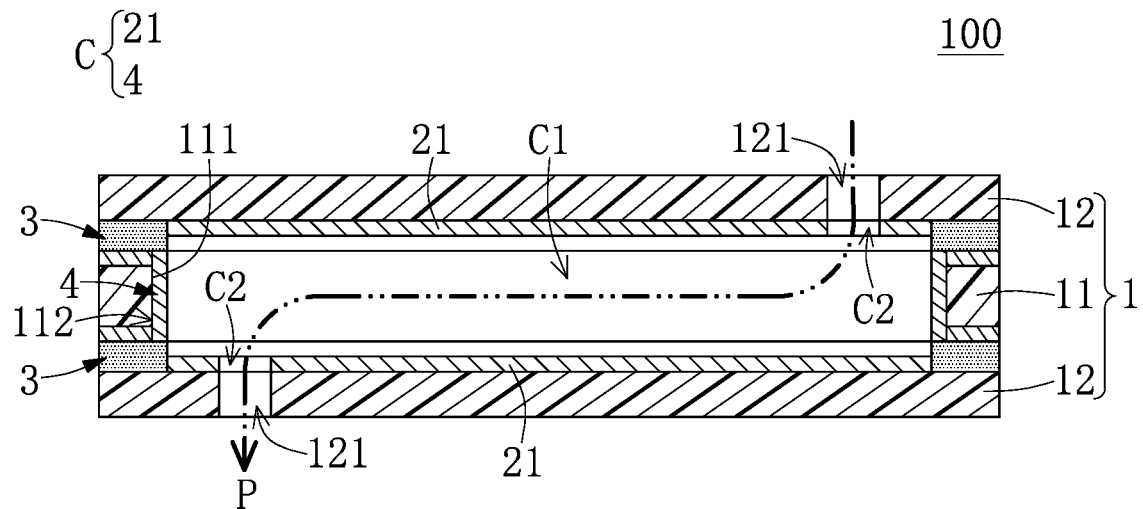
FIG. 6A is a cross-sectional view taken along a cross-sectional line VIA-VIA of FIG. 5.
Figure 6B:
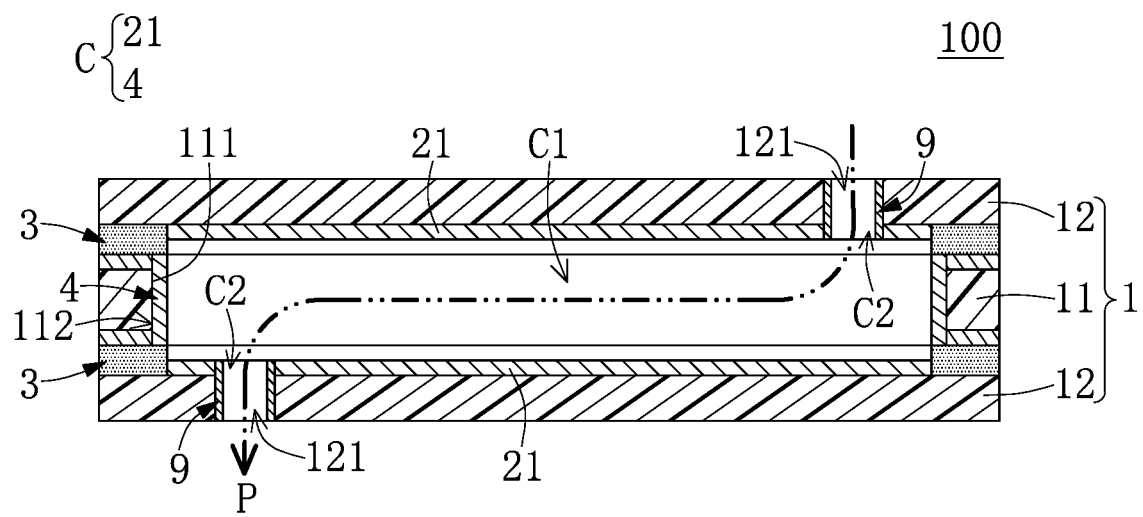
FIG. 6B is a cross-sectional view showing the electromagnetic wave transmission board of FIG. 6A in another configuration.
Figure 7:
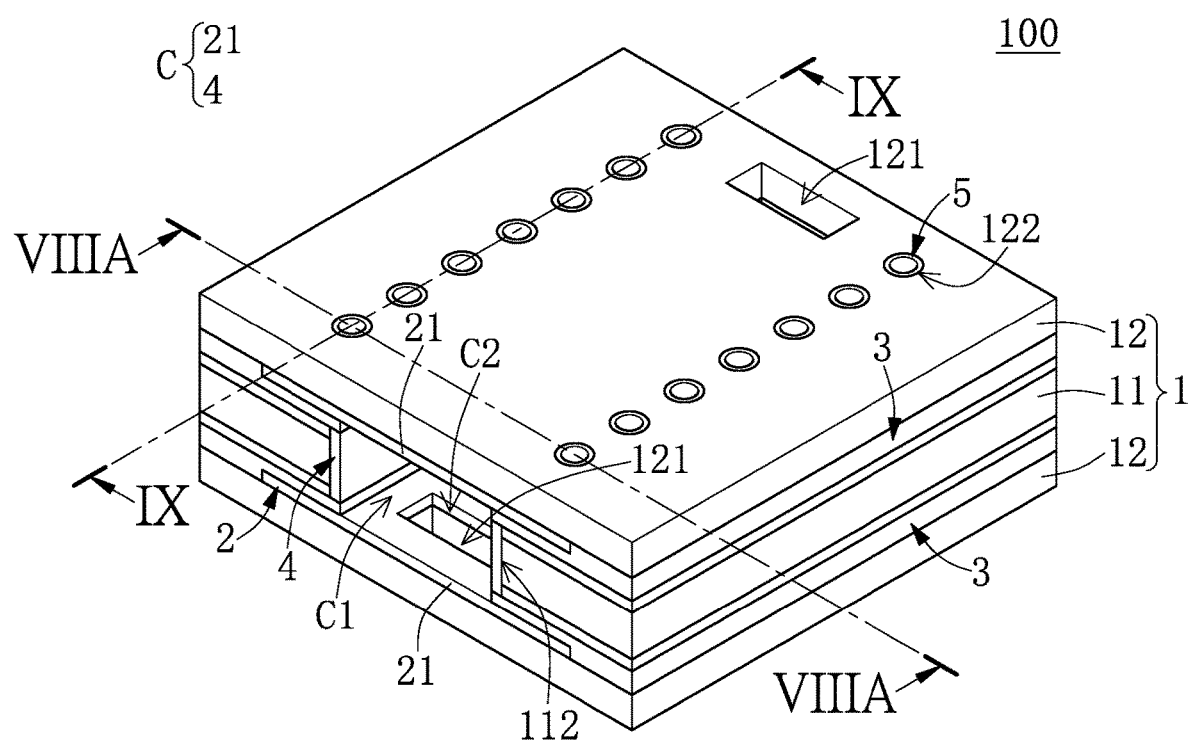
FIG. 7 is a perspective view of an electromagnetic wave transmission board according to a second embodiment of the present disclosure.

It should be noted that the predetermined space C1 of the electromagnetic wave transmission board 100 shown in FIG. 1 and FIG. 4A can be in air communication with the external space through each of the entrances C2 and the corresponding opening 121, but the present disclosure is not limited thereto. For example, as shown in FIG. 4B, the two outer plates 12 can be formed with no opening 121, and the two entrances C2 are covered by at least one of the two outer plates 12. As shown in FIG. 5 and FIG. 6A, the predetermined space C1 (FIG. 6A) of the electromagnetic wave transmission board 100 can be in air communication with an external space only through each of the entrances C2 (FIG. 6A) and the corresponding opening 121, thereby establishing a medium path P. In other embodiments of the present disclosure, the two outer plates 12 can be formed with only one opening 121 corresponding in position to one of the two entrances C2, and the other entrance C2 is covered by one of the two outer plates 12. Moreover, as shown in FIG. 6B, the predetermined space C1 and the two entrances C2 of the inner channel structure C can cooperate with the two openings 121 of the two outer plates 12 to jointly form a medium path P, and walls defining the entrance C2 and the corresponding opening 121 can be coated with a plated layer 9, thereby more completely transmitting an electromagnetic wave signal.

Figure 4C:
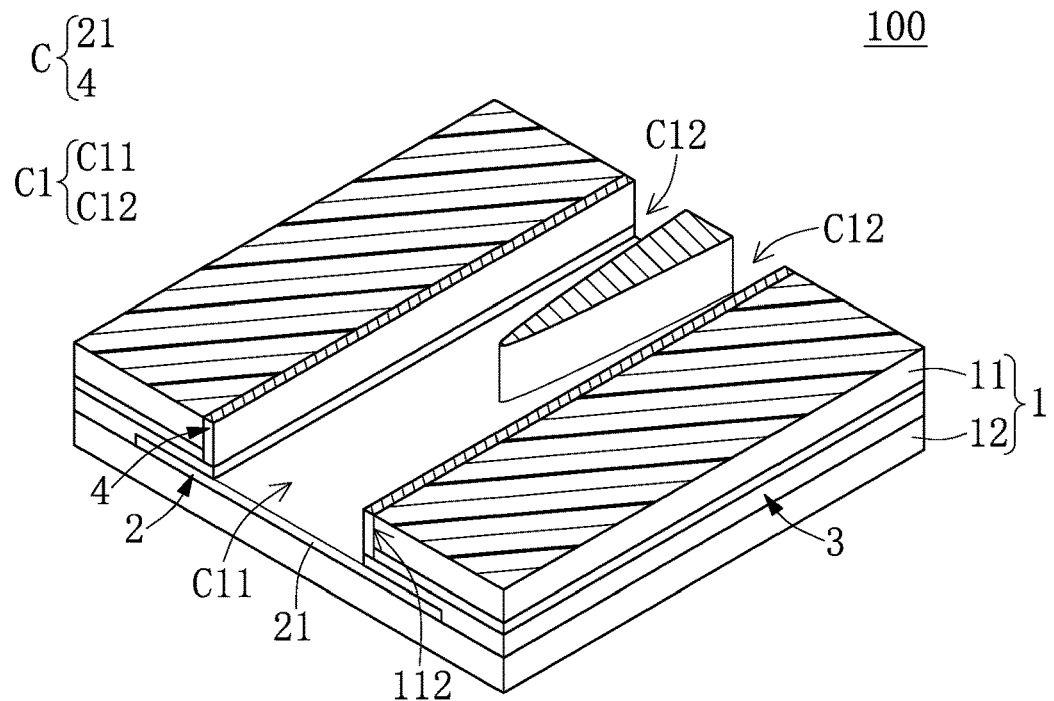
FIG. 4C is a cross-sectional view showing the electromagnetic wave transmission board in a third variant configuration.

In addition, the inner channel structure C of the present embodiment can be adjusted or changed according to design requirements, and is not limited to an elongated structure. For example, as shown in FIG. 4C, the predetermined space C1 of the electromagnetic wave transmission board 100 includes a first runner C11 and a second runner C12 that is in air communication with first runner C11, thereby satisfying other design requirements.

In the present embodiment, the electromagnetic wave transmission board 100 can include a composite board and the plated metal layers 4. In other words, the composite board includes components (e.g., the multilayer structure 1, the conductive layer 2, and the adhesive 3) of the electromagnetic wave transmission board 100 other than the plated metal layers 4. The composite board has a plurality of inner walls surroundingly defining an elongated channel in an interior of the composite board. The plated metal layers 4 are formed on at least part of the inner walls (e.g., the inner walls 111 of the inner plate 11) so as to jointly form the inner channel structure C in the channel. The inner walls of the inner plate 11 and the shielding portions 21 can jointly define at least part of the channel.

Accordingly, the predetermined space C1 of the inner channel structure C is configured to receive and output an electromagnetic wave signal through the two entrances C2, respectively, and the electromagnetic wave transmission board 100 is configured to transmit the electromagnetic wave signal by using the air in the predetermined space C1 of the inner channel structure C as a conductive medium.

SECOND EMBODIMENT

Referring to FIGS. 7, 8A, 8B, 8C, 9 and 10, a second embodiment of the present disclosure is similar to the first embodiment of the present disclosure, so that the descriptions of the same components in the first and second embodiments of the present disclosure will be omitted for the sake of brevity, and the following description only discloses different features between the first and second embodiments.

The electromagnetic shield provided by the inner channel structure C (FIGS. 7, 8A, 8B and 8C) may be easily affected due to the adhesive 3 existing between each of the plated metal layers 4 (FIGS. 8A, 8B, and 8C) and the adjacent shielding portion 21 (FIGS. 7, 8A, 8B and 8C), so that the electromagnetic wave transmission board 100 of the present embodiment is provided for improving the above issues.

As shown in FIGS. 7, 8A, 8B 8C, and 9, the composite board has a plurality of slots 122 that are respectively recessed from outer surfaces of the two outer plates 12 to the conductive layers (not labeled) of the inner plate 11, and the slots 122 are respectively arranged at two opposite sides of and adjacent to the two shielding portions 21. Moreover, the electromagnetic wave transmission board 100 includes a plurality of electromagnetic shielding posts 5 respectively arranged in the slot 122. The electromagnetic shielding posts 5 are respectively connected to the conductive layers of the inner plate 11, thereby improving the electromagnetic shield of the inner channel structure C.

Figure 8A:
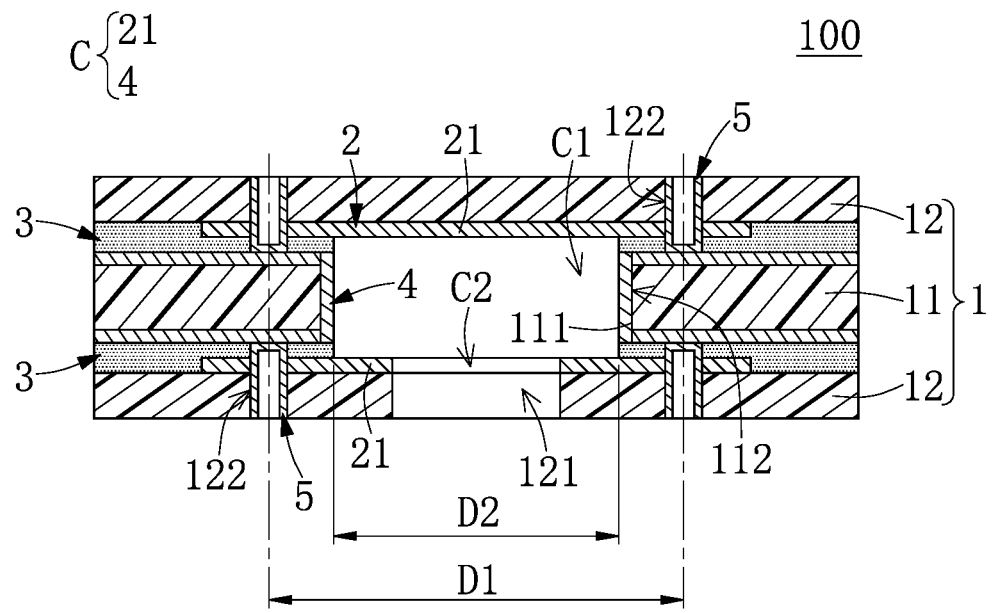
FIG. 8A is a cross-sectional view taken along a cross-sectional line VIIIA-VIIIA of FIG. 7.
Figure 9:
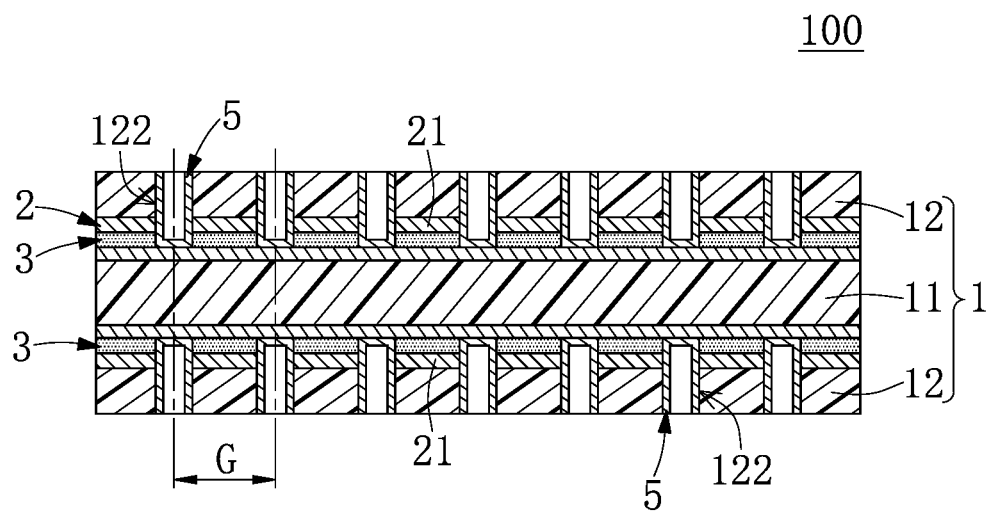
FIG. 9 is a cross-sectional view taken along a cross-sectional line IX-IX of FIG. 7.

Specifically, in each of the outer plates 12, the corresponding slots 122 in the present embodiment are arranged in two rows respectively at two opposite sides of the corresponding shielding portion 21, and a distance D1 between the two rows of the slots 122 is 105-150% of a distance D2 between two of the plated metal layers 4 facing and adjacent to each other as shown in FIG. 8A. Any two of the slots 122 in each row have the same interval G as shown in FIG. 9. Accordingly, the electromagnetic shielding posts 5 can be provided for further increasing the electromagnetic shield of the inner channel structure C through the above arrangement of the slots 122, but the present disclosure is not limited thereto.

Figure 10:
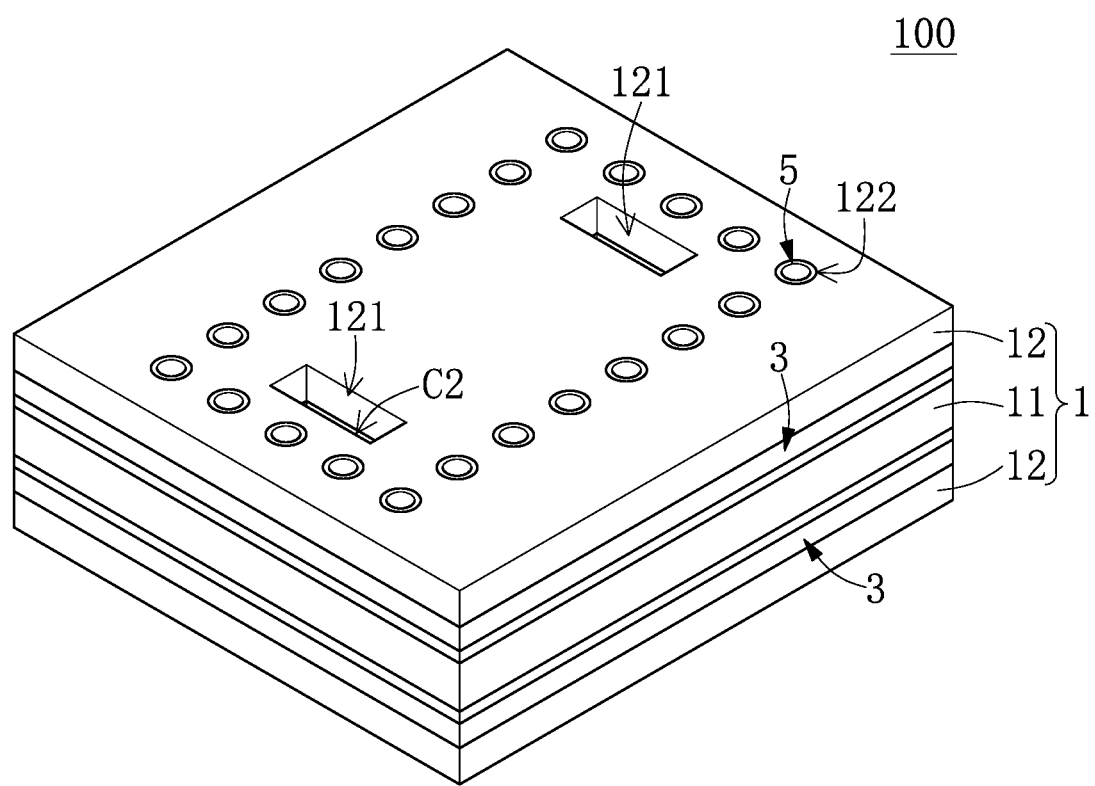
FIG. 10 is a perspective view of the electromagnetic wave transmission board in another configuration according to the second embodiment of the present disclosure.

In addition, as shown in FIG. 10, when the predetermined space similar to the predetermined space C1 of FIG. 8A) of the electromagnetic wave transmission board 100 is in air communication with an external space only through each of the entrances C2 and the corresponding opening 121, the electromagnetic shielding posts 5 (and the slots 122) are respectively arranged around the shielding portions (similar to the shielding portions 21 of FIG. 8A). In other embodiments of the present disclosure, the two outer plates 12 can be formed without any opening 121, and the two entrances C2 are covered by the two outer plates 12 or are fully filled with a resin. Or, the two outer plates 12 can be formed with only one opening 121 corresponding in position to one of the two entrances C2, and the other entrance C2 is covered by one of the two outer plates 12.

Figure 8B:
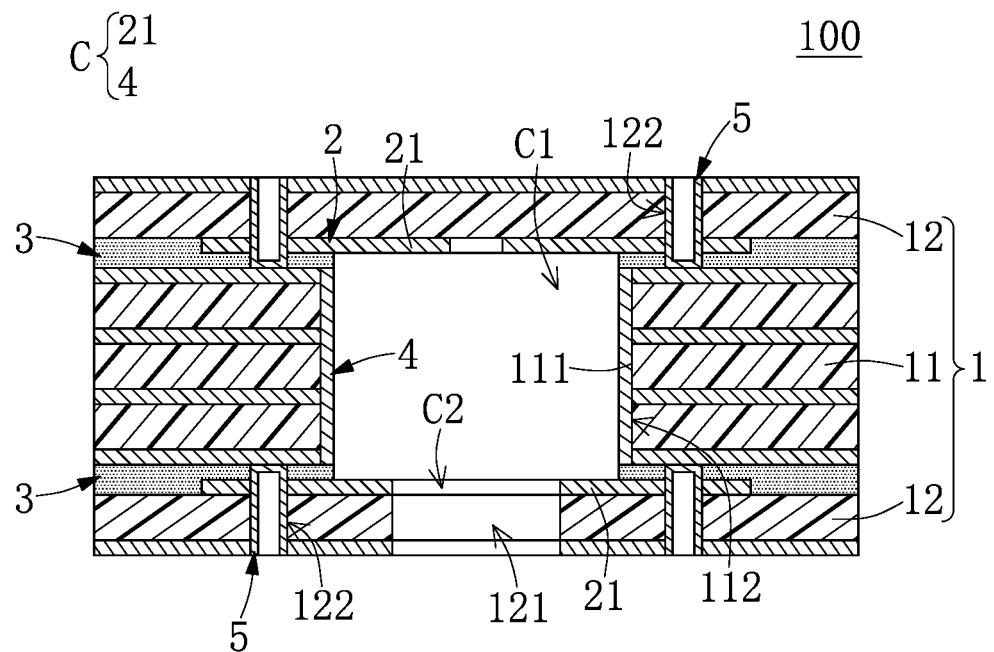
FIG. 8B is a cross-sectional view showing the electromagnetic wave transmission board of FIG. 8A in another configuration.
Figure 8C:
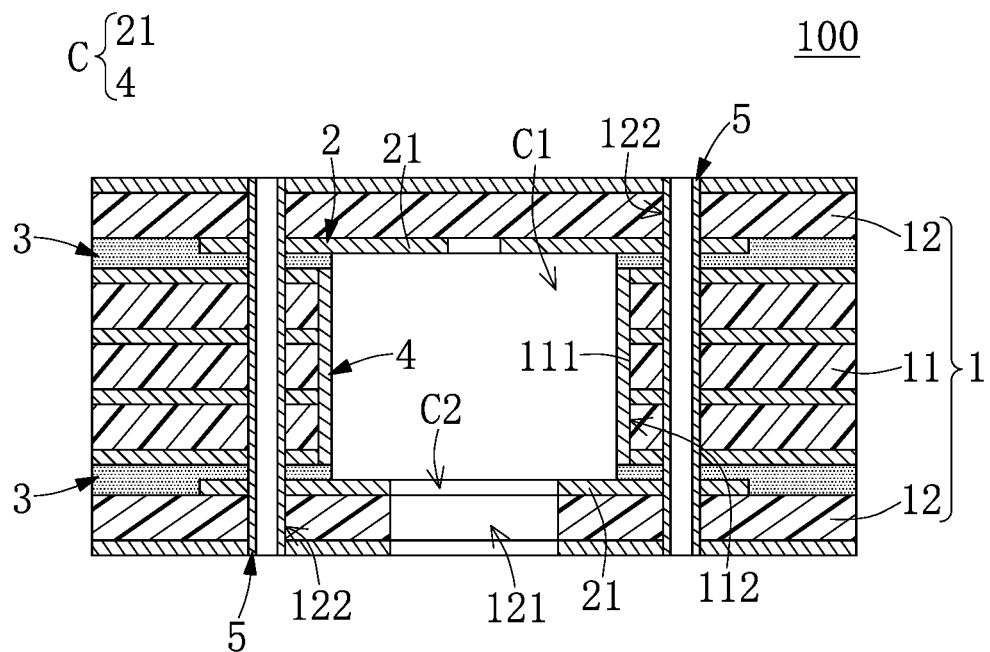
FIG. 8C is a cross-sectional view showing the electromagnetic wave transmission board of FIG. 8B in another configuration.

As shown in FIG. 8B, the inner plate 11 can be a multilayer plate, and each of the two outer plates 12 can be formed with a conductive layer (not labeled) disposed on an outer surface thereof. In other words, each of the conductive layers can be regarded as a portion of the corresponding outer plate 12. A portion of one of the two shielding portions 21 on one of the two outer plates 12 (e.g., the upper outer plate 12 shown in FIG. 8B) can be removed, and the other outer plate 12 (e.g., the lower outer plate 12 shown in FIG. 8B) can be formed with the two openings 121. Moreover, as shown in FIG. 8C, any one of the slots 122 can be formed to penetrate through the electromagnetic wave transmission board 100, and is formed with one of the electromagnetic shielding posts 5 arranged therein.

It should be noted that the electromagnetic wave transmission board 100 in the present embodiment can include a composite board and the plated metal layers 4. In other words, the composite board includes components (e.g., the multilayer structure 1, the conductive layer 2, the adhesive 3, and the electromagnetic shielding posts 5) of the electromagnetic wave transmission board 100 other than the plated metal layers 4.

THIRD EMBODIMENT

Referring to FIGS. 11, 12, 13, 14 and 15, a third embodiment of the present disclosure provides is similar to the first embodiment of the present disclosure, so that the descriptions of the same components in the first and third embodiments of the present disclosure will be omitted for the sake of brevity, and the following description only discloses different features between the first and third embodiment.

Figure 11:
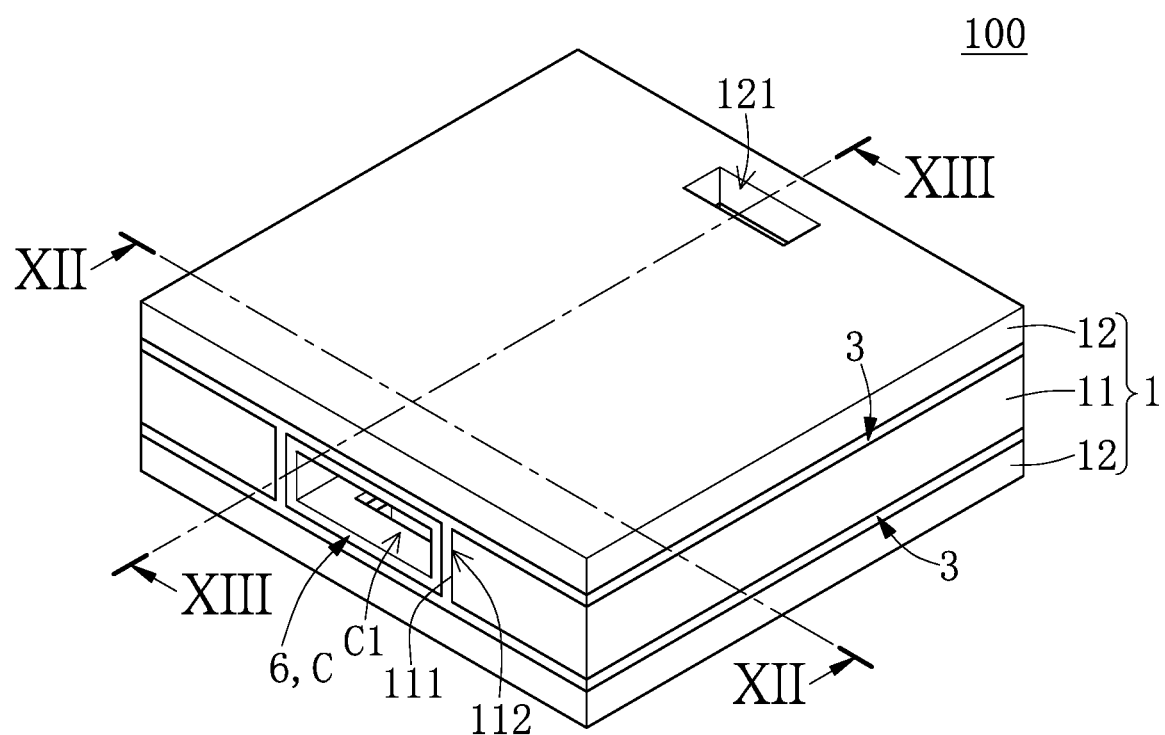
FIG. 11 is a perspective view of an electromagnetic wave transmission board according to a third embodiment of the present disclosure.
Figure 12:
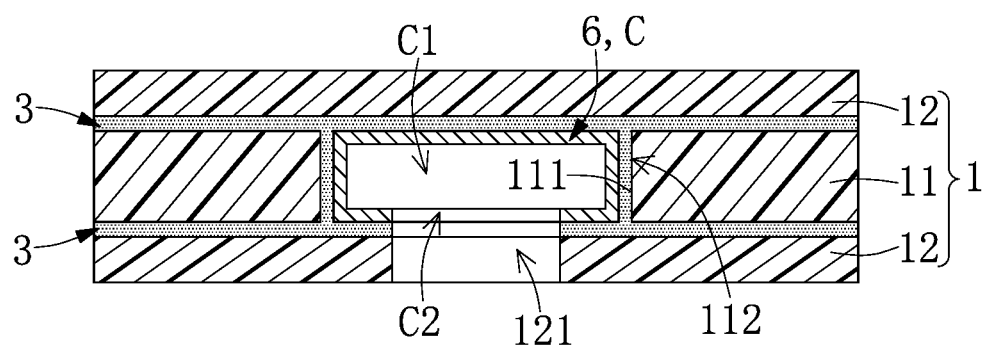
FIG. 12 is a cross-sectional view taken along a cross-sectional line XII-XII of FIG. 11.
Figure 13:
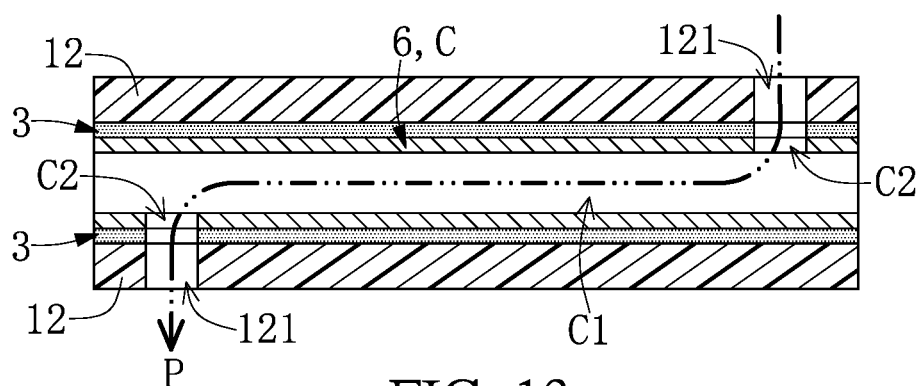
FIG. 13 is a cross-sectional view taken along a cross-sectional line XIII-XIII of FIG. 11.

As shown in FIGS. 11, 12 and 13, the electromagnetic wave transmission board 100 in the present embodiment includes a multilayer structure 1, an adhesive 3, and a metal tube 6. The predetermined space C1 and the two entrances C2 of the inner channel structure C can cooperate with the two openings 121 of the two outer plates 12 to jointly form a medium path P. The multilayer structure 1 (FIGS. 11 and 12) and the adhesive 3 of the present embodiment is substantially identical to that of the first embodiment, so that the multilayer structure 1 and the adhesive 3 in the following descriptions will be omitted for the sake of brevity. The metal tube 6 is an inner channel structure C having two entrances C2 and embedded in the thru-hole 112 of the inner plate 11, as shown in FIGS. 11 and 12, and the metal tube 6 is fixed to the inner plate 11 and the two outer plates 12 through the adhesive 3.

The metal tube 6 in the present embodiment is a one-piece structure. The predetermined space C1 surrounded by the metal tube 6 can be in air communication with an external space though each of the two entrances C2 and the corresponding opening 121, or can be in air communication with an external space though other portions of the metal tube 6, but the present disclosure is not limited thereto.

Figure 14:
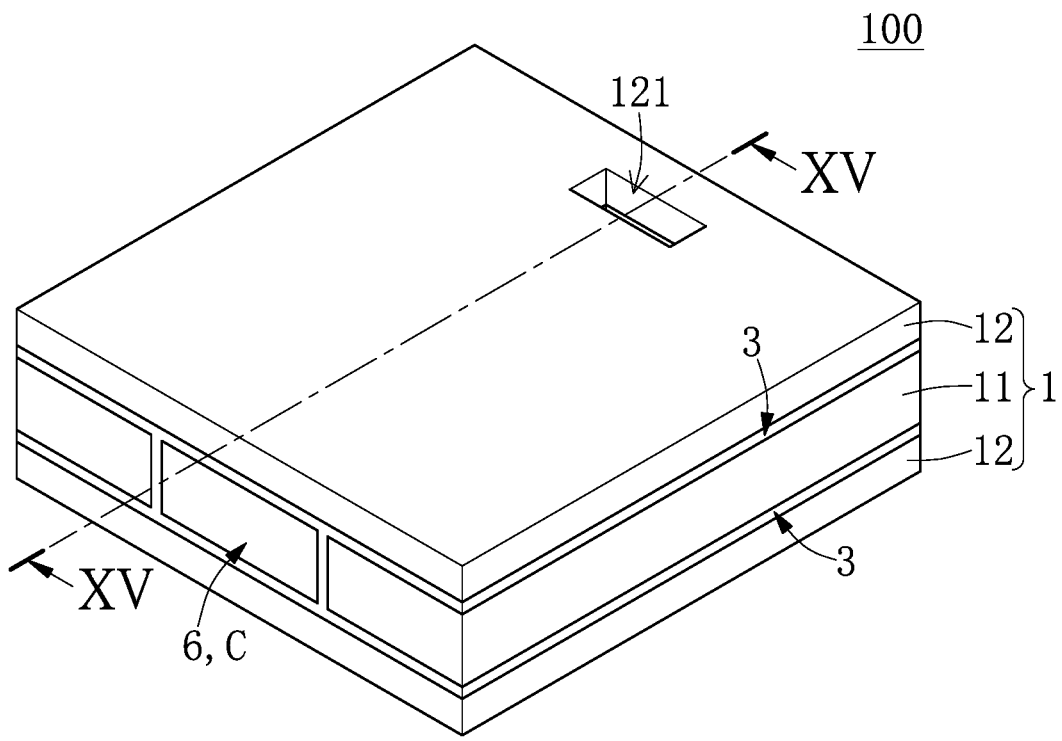
FIG. 14 is a perspective view of the electromagnetic wave transmission board in another configuration according to the third embodiment of the present disclosure.
Figure 15:
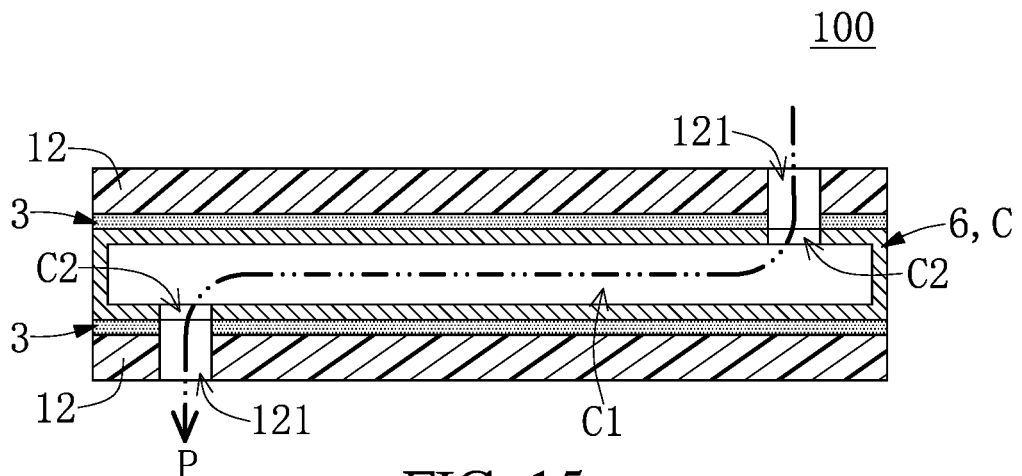
FIG. 15 is a cross-sectional view taken along a cross-sectional line XV-XV of FIG. 14.

For example, as shown in FIG. 14 and FIG. 15, the predetermined space C1 (FIG. 15) surrounded by the metal tube 6 is in air communication with an external space only though each of the two entrances C2 (FIG. 15) and the corresponding opening 121. In other embodiments of the present disclosure, the metal tube 6 can be formed by at least two components (e.g., a trough structure and a cover).

Specifically, the two outer plates 12 in the present embodiment each have an opening 121, and the predetermined space Cl and the two entrances C2 of the metal tube 6 can cooperate with the two openings 121 of the two outer plates 12 to jointly form a medium path P (FIG. 15) penetrating through the electromagnetic wave transmission board 100, but the present disclosure is not limited thereto.

For example, in other embodiments of the present disclosure, the two openings 121 can be formed in one of the two outer plates 12, the other outer plate 12 does not have any opening 121, and the two entrances C2 of the metal tube 6 correspond in position to the two openings 121.

In addition, medium in the predetermined space C1, the two entrances C2, and the two openings 121 in the present embodiment is limited to air, but the present disclosure is not limited thereto.

When the adhesive 3 flows during a lamination process of the multilayer structure 1, a portion of the adhesive 3 between any one of the two outer plates 12 and the inner plate 11 is blocked by the metal tube 6, so that the adhesive 3 cannot flow into the predetermined space C1. Accordingly, the metal tube 6 (or the inner channel structure C as shown in FIG. 14) can provide a better electromagnetic shield.

Figure 16:
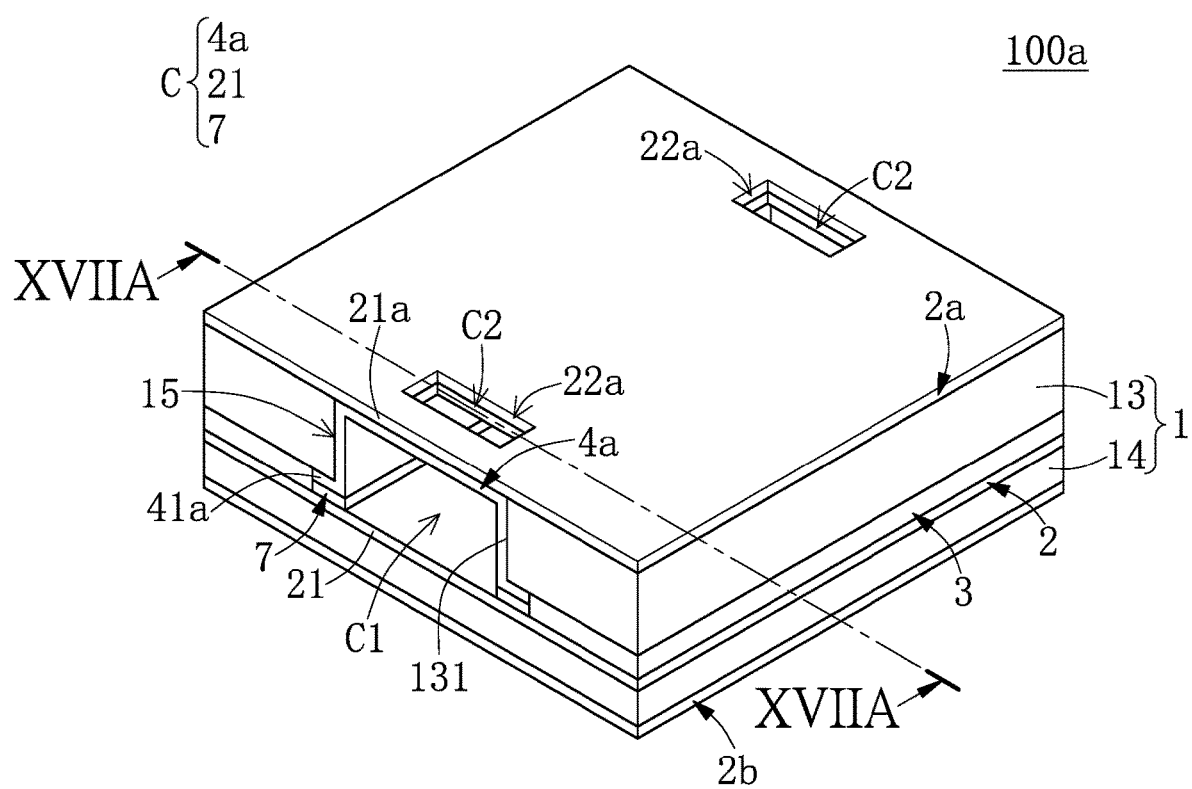
FIG. 16 is a perspective view of an electromagnetic wave transmission board according to a fourth embodiment of the present disclosure.
Figure 17A:
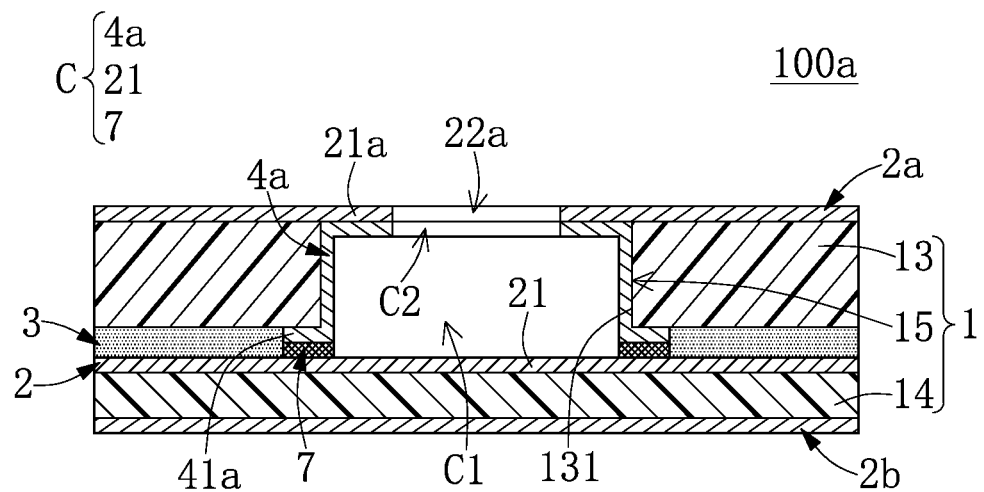
FIG. 17A is a cross-sectional view taken along a cross-sectional line XVIIA-XVIIA of FIG. 16.
Figure 17B:
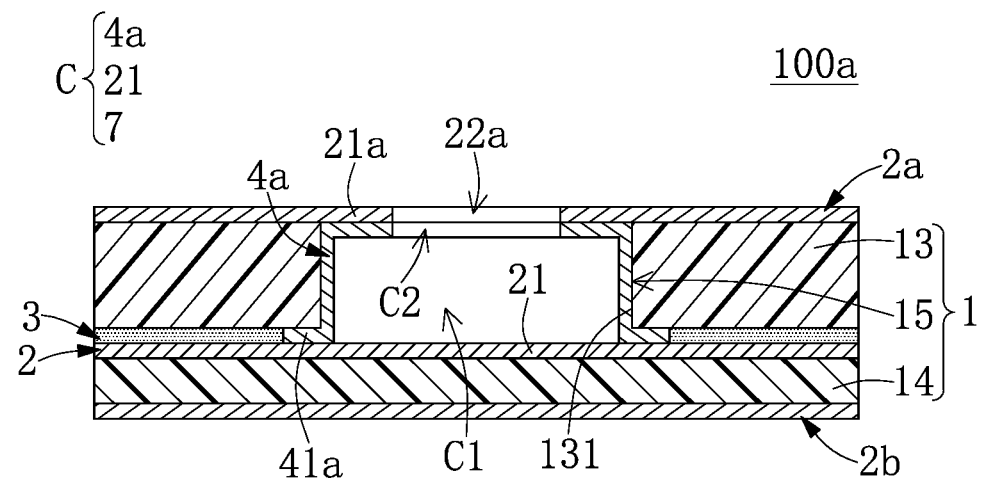
FIG. 17B is a cross-sectional view showing the electromagnetic wave transmission board of FIG. 17A in another configuration.
Figure 18:
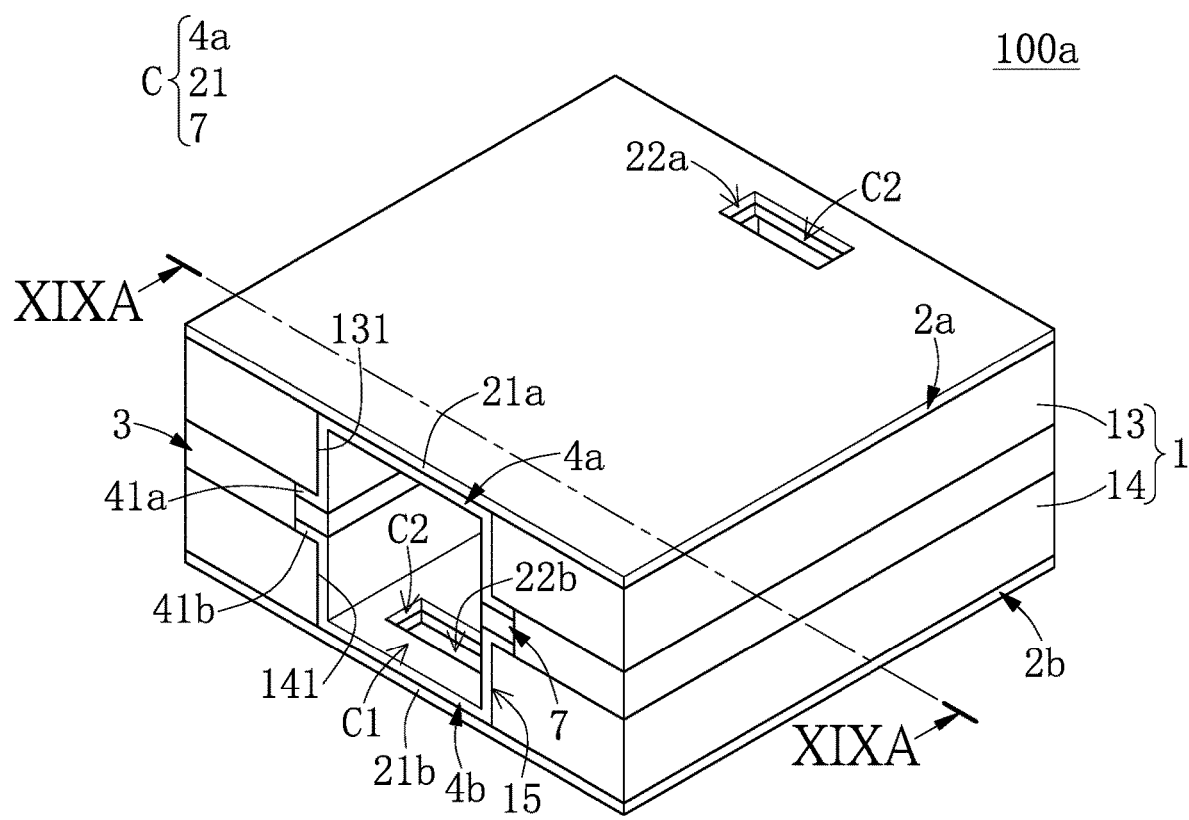
FIG. 18 is a perspective view of an electromagnetic wave transmission board according to a fifth embodiment of the present disclosure.
Figure 19A:
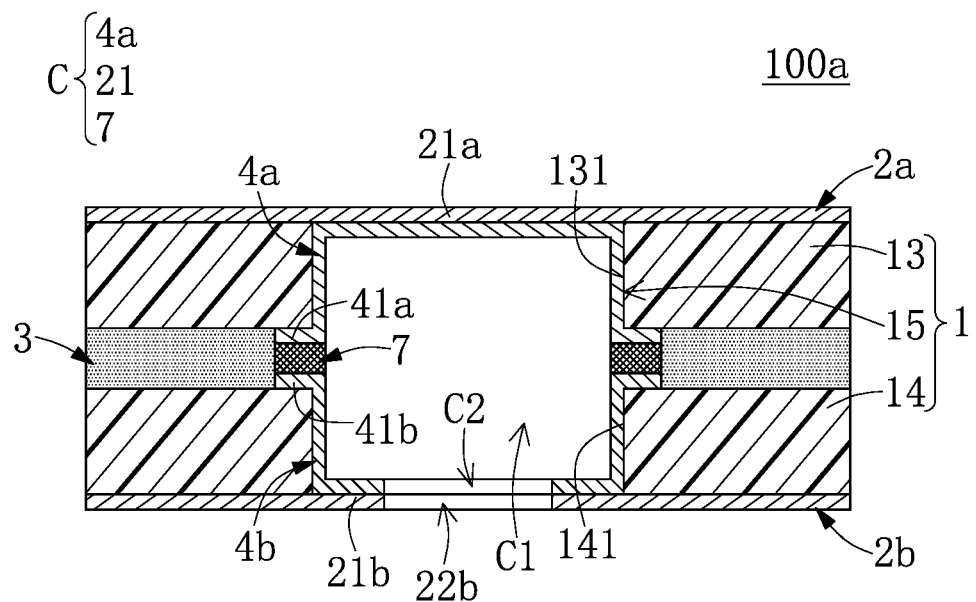
FIG. 19A is a cross-sectional view taken along a cross-sectional line XIXA-XIXA of FIG. 18.
Figure 19B:
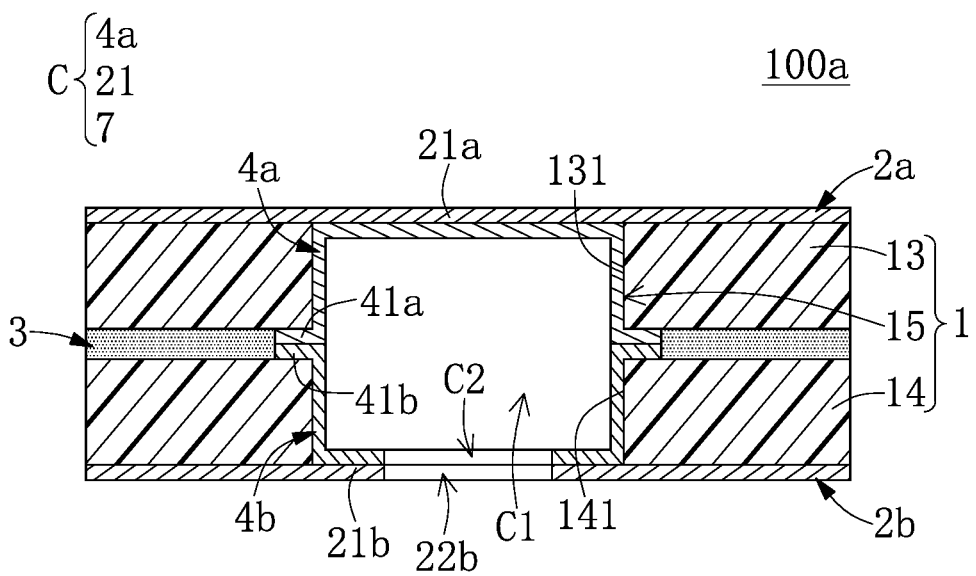
FIG. 19B is a cross-sectional view showing the electromagnetic wave transmission board of FIG. 19A in another configuration.

In addition, as shown in FIGS. 16, 17A, 17B, 18, 19A and 19B, the present disclosure also provides an electromagnetic wave transmission board 100a, which includes a multilayer structure 1, a first conductive layer 2a and a second conductive layer 2b respectively disposed on two opposite surfaces of the multilayer structure 1, and an inner channel structure C arranged in the multilayer structure 1. The multilayer structure 1 surroundingly defines a thru-hole 15. At least one of the first conductive layer 2a and the second conductive layer 2b covers at least one side of the thru-hole 15, and has two openings 22a as shown in FIGS. 16, 17A 17B and 18 (and 22b as shown in FIGS. 18, 19A and 19B).

The inner channel structure C is arranged in the thru-hole 15 of the multilayer structure 1, and surroundingly defines a predetermined space C1. The inner channel structure C has two entrances C2 in air communication with the predetermined space C1. Specifically, the two entrances C2 respectively correspond in position to the two openings 22a (and 22b), so that the predetermined space C1 can be in air communication with an external space through each of the two entrances C2 and the corresponding opening 22a (or 22b).

The structure of the electromagnetic wave transmission board 100a is different from the circuit board discussed in the background of the present disclosure by using the predetermined space C1 and the two entrances C2 to cooperate with the two openings 22a (and 22b) that are formed in at least one of the first conductive layer 2a and the second conductive layer 2b, thereby expanding the range of application of the electromagnetic wave transmission board 100a. The electromagnetic wave transmission board 100a having the above features can be formed in a plurality of different structures, so that the following description only describes the following fourth and fifth embodiments, but the present disclosure is not limited thereto.

FOURTH EMBODIMENT

Referring to FIGS. 16, 17A and 17B, a fourth embodiment of the present disclosure provides an electromagnetic wave transmission board 100a. The electromagnetic wave transmission board 100a includes a multilayer structure 1, a first conductive layer 2a and a second conductive layer 2b both respectively disposed on two opposite surfaces of the multilayer structure 1, and an inner channel structure C arranged in the multilayer structure 1.

As shown in FIG. 16 and FIG. 17A, the multilayer structure 1 includes an upper plate 13 and a lower plate 14. The upper plate 13 defines a thru-hole 15 and has a plurality of inner walls 131. The electromagnetic wave transmission board 100a further includes an adhesive 3 bonding the upper plate 13 and the lower plate 14. Moreover, the first conductive layer 2a covers (or is disposed on) an outer surface of the upper plate 13 (e.g., a top surface of the upper plate 13 shown in FIG. 17A), and includes a first shielding portion 21a covering one side (e.g., an upper side) of the thru-hole 15 and having two openings 22a. The second conductive layer 2b covers an outer surface of the lower plate 14 (e.g., a bottom surface of the lower plate 14 shown in FIG. 17A).

The inner channel structure C includes a first plated metal layer 4a arranged in the thru-hole 15, a shielding portion 21 disposed on an inner surface of the lower plate 14, and a barrier 7 sandwiched between the first plated layer 4a and the shielding portion 21. The first plated metal layer 4a is formed (e.g., coated) on the inner walls 131 and the first shielding portion 21a, and has two entrances C2 respectively corresponding in position to the two openings 22a.

Specifically, the first plated metal layer 4a includes two first extending portions 41a arranged on two ends thereof, and the two first extending portions 41a are formed on portions of an inner surface of the upper plate 13 adjacent to the inner walls 131 of the upper plate 13 (e.g., two portions of the inner surface of the upper plate 13 respectively adjacent to the inner wall 131 at the left and the inner wall 131 at the right shown in FIG. 17A).

The barrier 7 in the present embodiment is formed by an electrically conductive material (e.g., metal or conductive adhesive) for preventing an electromagnetic wave signal from traveling out of the inner channel structure C, but the present disclosure is not limited thereto. The barrier 7 is sandwiched between the shielding portion 21 and the two first extending portions 41a, so that the first plated metal layer 4a, the shielding portion 21, and the barrier 7 can jointly form a predetermined space C1. The barrier 7 can be used to block the adhesive 3, thereby preventing the adhesive 3 from flowing into the predetermined space C1. The barrier 7 in the present embodiment includes two parts (not labeled) disposed on the shielding portion 21 and respectively connected to the two first extending portions 41a, but the present disclosure is not limited thereto. For example, as shown in FIG. 17B, the electromagnetic wave transmission board 100a can be formed without the barrier 7, and the first extending portions 41a of the plated metal layer 4a abut against the shielding portion 21 for being configured to block the adhesive 3 from flowing into the predetermined space C1.

Accordingly, the predetermined space C1 can be in air communication with an external space through each of the two entrances C2 and the corresponding opening 22a, so that the structure of the electromagnetic wave transmission board 100a is different from that of the circuit board discussed in the background of the present disclosure for expanding the range of application of the electromagnetic wave transmission board 100a.

It should be noted that the number of each component of the electromagnetic wave transmission board 100a can be adjusted or changed according to design requirements, and is not limited to the present embodiment. For example, the number of the first plated metal layer 4a, the first extending portion 41a, or the barrier 7 can be at least one.

In addition, the electromagnetic wave transmission board 100a in the present embodiment can be defined to include a composite board and a plated metal layer 4. In other words, the plated metal layer 4 is the first plated metal layer 4a, and the composite board includes components (e.g., the multilayer structure 1, the conductive layer 2, the first conductive layer 2a, the second conductive layer 2b, the adhesive 3, and the barrier 7) of the electromagnetic wave transmission board 100a other than the first plated metal layer 4a.

FIFTH EMBODIMENT

Referring to FIGS. 18, 19A and 19B, a fifth embodiment of the present disclosure provides an electromagnetic wave transmission board 100a. The electromagnetic wave transmission board 100a includes a multilayer structure 1, a first conductive layer 2a and a second conductive layer 2b both respectively disposed on two opposite surfaces of the multilayer structure 1, and an inner channel structure C arranged in the multilayer structure 1.

The multilayer structure 1 includes an upper plate 13 and a lower plate 14. The upper plate 13 and the lower plate 14 each have a plurality of inner walls 131, 141 for jointly defining a thru-hole 15. The electromagnetic wave transmission board 100a further includes an adhesive 3 bonding the upper plate 13 and the lower plate 14. Moreover, the first conductive layer 2a covers (or is disposed on) an outer surface of the upper plate 13 (e.g., a top surface of the upper plate 13 shown in FIG. 19A), and includes a first shielding portion 21a covering one side (e.g., an upper side) of the thru-hole 15. The second conductive layer 2b covers (or is disposed on) an outer surface of the lower plate 14 (e.g., a bottom surface of the lower plate 14 shown in FIG. 19A), and includes a second shielding portion 21b covering another side (e.g., a lower side) of the thru-hole 15. The first shielding portion 21a and the second shielding portion 21b each have an opening 22a, 22b.

The inner channel structure C includes a first plated metal layer 4a and a second plated metal layer 4b both arranged in the thru-hole 15, and includes a barrier 7 sandwiched between the first plated layer 4a and the second plated metal layer 4b. The first plated metal layer 4a is formed (e.g., coated) on the inner walls 131 and the first shielding portion 21a, and has an entrance C2 corresponding in position to one of the two openings 22a. The second plated metal layer 4b is formed (e.g., coated) on the inner walls 141 and the second shielding portion 21b, and has an entrance C2 corresponding in position to the other opening 22b.

Specifically, the first plated metal layer 4a includes two first extending portions 41a arranged on two ends thereof, and the two first extending portions 41a are formed on portions of an inner surface of the upper plate 13 adjacent to the inner walls 131 of the upper plate 13. The second plated metal layer 4b includes two second extending portions 41b arranged on two ends thereof. The two second extending portions 41b are formed on portions of an inner surface of the lower plate 14 adjacent to the inner walls 141 of the lower plate 14, and respectively face the two first extending portions 41a.

The barrier 7 in the present embodiment is formed by an electrically conductive material (e.g., metal or conductive adhesive) for preventing an electromagnetic wave signal from traveling out of the inner channel structure C, but the present disclosure is not limited thereto. The barrier 7 is sandwiched between the two first extending portions 41a and the two second extending portions 41b, so that the first plated metal layer 4a, the second plated metal layer 4b, and the barrier 7 can jointly form a predetermined space C1. The barrier 7 can be used to block the adhesive 3, thereby preventing the adhesive 3 from flowing into the predetermined space C1. The barrier 7 in the present embodiment includes two parts (not labeled) respectively disposed on the two second extending portions 41b and respectively connected to the two first extending portions 41a, but the present disclosure is not limited thereto. For example, as shown in FIG. 19B, the electromagnetic wave transmission board 100a can be formed without the barrier 7, and the two first extending portions 41a of the plated metal layer 4a respectively abut against the two second extending portions 41b of the second plated metal layer 4b so as to block the adhesive 3 from flowing into the predetermined space C1.

It should be noted that the number of each component of the electromagnetic wave transmission board 100a can be adjusted or changed according to design requirements, and is not limited to the present embodiment. For example, the number of the first plated metal layer 4a, the first extending portion 41a, the second plated metal layer 4b, the second extending portion 41b, or the barrier 7 can be at least one.

In addition, the electromagnetic wave transmission board 100a in the present embodiment can include a composite board and at least one plated metal layer 4. In other words, the at least one plated metal layer 4 includes the first plated metal layer 4a and the second plated metal layer 4b, and the composite board includes components (e.g., the multilayer structure 1, the first conductive layer 2a, the second conductive layer 2b, the adhesive 3, and the barrier 7) of the electromagnetic wave transmission board 100a other than the first plated metal layer 4a and the second plated metal layer 4b.

Sixth Embodiment

Figure 20:
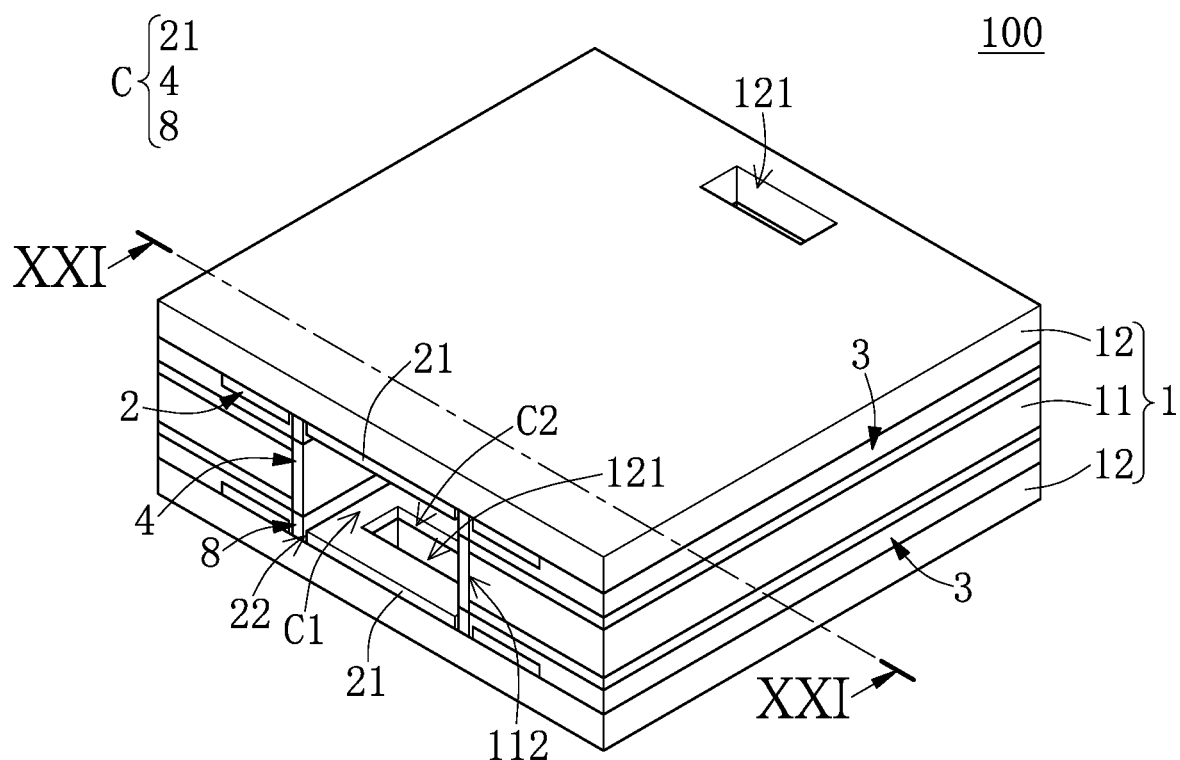
FIG. 20 is a perspective view of an electromagnetic wave transmission board according to a sixth embodiment of the present disclosure.
Figure 21:
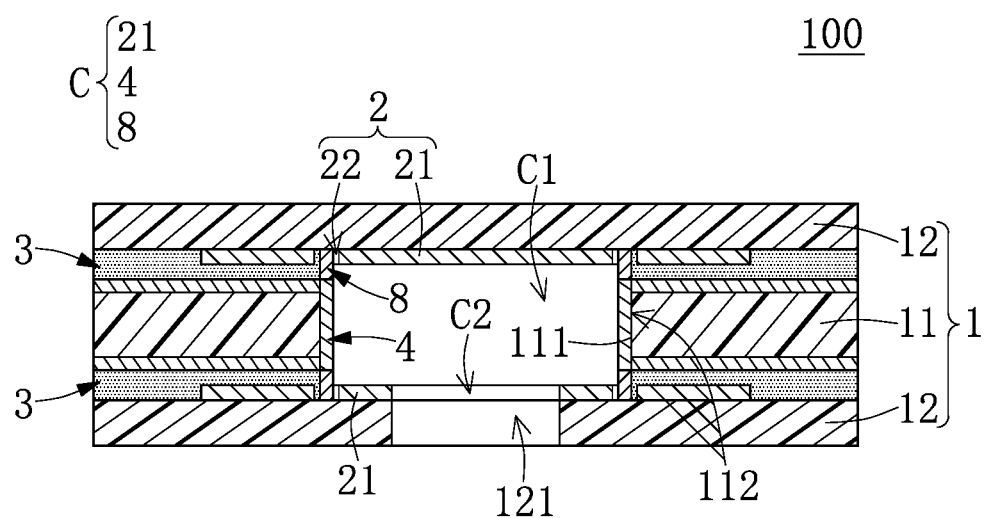
FIG. 21 is a cross-sectional view taken along a cross-sectional line XXI-XXI of FIG. 20.

Referring to FIG. 20 and FIG. 21, a sixth embodiment of the present disclosure provides is similar to the first embodiment of the present disclosure, so that the descriptions of the same components in the first and sixth embodiments of the present disclosure will be omitted for the sake of brevity, and the following description only discloses different features between the first and sixth embodiment.

In the present embodiment, each of the two conductive layers 2 has a concave structure 22 (e.g., two grooves shown in FIG. 21) arranged outside of the shielding portion 21, and the concave structure 22 of each of the two conductive layers 2 is preferably formed to expose a part of the inner surface of the corresponding outer plate 12, but the present disclosure is not limited thereto.

Moreover, the electromagnetic wave transmission board 100 includes a plurality of plated ribs 8 respectively connected to the plated metal layers 4, and the plated ribs 8 are part of the inner channel structure C. The plated ribs 8 are arranged in the concave structures 22 of the two conductive layers 2, respectively, so that the plated ribs 8 can be configured to block the adhesive 3 from flowing into the predetermined space C1 for effectively improving the electromagnetic shield of the inner channel structure C.

Specifically, the plated ribs 8 in the present embodiment are formed by plating from top ends and bottom ends of the plated metal layers 4 toward the outer plates 12, and the plated ribs 8 are spaced apart from each other, but the present disclosure is not limited thereto. For example, when the plated ribs 8 are applied to the electromagnetic wave transmission board 100 shown in FIG. 5 and FIG. 6A, the plated ribs 8 can be formed in two annular structures respectively connected to the top ends and the bottom ends of the plated metal layers 4.

In addition, in other embodiments of the present disclosure, each of the two outer plates 12 can be formed without any opening 121, and the two entrances C2 are covered by the two outer plates 12 or are fully filled with a resin. Or, the two outer plates 12 can be formed with only one opening 121 corresponding in position to one of the two entrances C2, and the other entrance C2 is covered by one of the two outer plates 12.

It should be noted that the electromagnetic wave transmission board 100 in the present embodiment can include a composite board and the plated metal layers 4. In other words, the composite board includes components (e.g., the multilayer structure 1, the conductive layer 2, the adhesive 3, and the plated ribs 8) of the electromagnetic wave transmission board 100 other than the plated metal layers 4.

In conclusion, the electromagnetic wave transmission board of the present disclosure can be formed with the inner channel structure in the composite board, and the electromagnetic wave transmission board can be configured to transmit an electromagnetic wave signal through the predetermined space and the two entrances of the inner channel structure, so that the electromagnetic wave transmission board of the present disclosure provided in a structure that can be easily manufactured.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An electromagnetic wave transmission board, comprising:
    a composite board including:
        a multilayer structure including an upper plate and a lower plate;
        an adhesive that connects the upper plate and the lower plate; and
        a first conductive layer and a second conductive layer respectively disposed on surfaces of the upper plate and the lower plate and the upper and lower plates have openings therein, wherein the first conductive layer, the second conductive layer, the adhesive, the upper plate and the lower plate jointly define an elongated channel in an interior of the composite board;
    a first plated metal layer and a second plated metal layer, wherein the first plated metal layer and the second plated metal layer are formed on inner walls of the first conductive later, the second conductive layer, the adhesive, the upper plate, and the lower plate, and wherein the first plated metal layer and the second plated metal layer have respective entrances that are positioned in alignment with the corresponding openings; and
    a barrier sandwiched between the first plated metal layer and the second plated metal layer, wherein the first plated metal layer, the second plated metal layer, and the barrier jointly form an inner channel structure in the elongated channel, wherein the inner channel structure surroundingly defines a predetermined space filled with air, and the barrier is configured to block the adhesive from flowing into the predetermined space, and wherein the predetermined space is in air communication with an external space extending through each of the entrances and the corresponding opening,
    wherein the predetermined space of the inner channel structure is configured to receive and output an electromagnetic wave signal through the two respective entrances, and the electromagnetic wave transmission board is configured to transmit the electromagnetic wave signal through the predetermined space of the inner channel structure.

2. The electromagnetic wave transmission board according to claim 1, wherein the first conductive layer covers an outer surface of the upper plate and includes a first shielding portion arranged at one side of the elongated channel, the second conductive layer covers an outer surface of the lower plate and includes a second shielding portion arranged at another side of the elongated channel, and the respective openings are formed in the first shielding portion and the second shielding portion, and wherein the first and/or second plated metal layers include:
    the first plated metal layer formed on the inner walls of the upper plate and the first shielding portion, wherein the first plated metal layer having a respective one of the entrances, and the first plated metal layer includes at least one first extending portion formed on a portion of the inner surface of the upper plate adjacent to the inner walls of the upper plate; and
    the second plated metal layer formed on the inner walls of the lower plate and the second shielding portion, wherein the second plated metal layer respectively including the other one of the entrances, and the second plated metal layer includes at least one second extending portion formed on a portion of the inner surface of the lower plate adjacent to the inner walls of the lower plate, and wherein the barrier is sandwiched between the at least one first extending portion and the at least one second extending portion so as to block the adhesive from flowing into the predetermined space.

* * * * *